United States Patent
Jeong et al.

(10) Patent No.: US 7,786,753 B2
(45) Date of Patent: Aug. 31, 2010

(54) OUTPUT DRIVER CIRCUIT, SEMICONDUCTOR MEMORY DEVICE INCLUDING THE OUTPUT DRIVER CIRCUIT, AND METHOD FOR OPERATING THE SEMICONDUCTOR MEMORY DEVICE

(75) Inventors: Chun-Seok Jeong, Kyoungki-Do (KR); Kee-Teok Park, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 36 days.

(21) Appl. No.: 12/165,101

(22) Filed: Jun. 30, 2008

(65) Prior Publication Data

US 2009/0273363 A1 Nov. 5, 2009

(30) Foreign Application Priority Data

Apr. 30, 2008 (KR) ...................... 10-2008-0040370

(51) Int. Cl.
*H03K 19/003* (2006.01)
(52) U.S. Cl. .......................................... 326/30; 326/29
(58) Field of Classification Search ............. 326/26–27, 326/29, 30; 327/170
See application file for complete search history.

(56) References Cited

U.S. PATENT DOCUMENTS 5,355,029 A * 10/1994 Houghton et al. ............. 326/26

| | | | |
|---|---|---|---|
| 6,538,464 B2 * | 3/2003 | Muljono et al. | 326/27 |
| 2005/0231251 A1 * | 10/2005 | Im et al. | 327/170 |
| 2006/0083079 A1 * | 4/2006 | Hwang et al. | 365/189.09 |

FOREIGN PATENT DOCUMENTS

| KR | 1020050062036 A | 6/2005 |
|---|---|---|
| KR | 1020050100997 A | 10/2005 |

OTHER PUBLICATIONS

Notice of Preliminary Rejection issued from Korean Intellectual Property Office on May 26, 2009 with an English Translation.

* cited by examiner

*Primary Examiner*—James Cho
(74) *Attorney, Agent, or Firm*—IP & T Law Firm PLC

(57) ABSTRACT

Output driver circuit, semiconductor memory device including the output driver circuit, and method for operating the semiconductor memory device, including a pre-driver to generate a pull-up control signal and a pull-down control signal according to a logic value of data to output, and to adjust and output a slew rate of the pull-up control signal and a slew rate of the pull-down control signal according to a termination resistance setting information, a pull-up driver to output logic high data in response to the pull-up control signal and a pull-down driver to output logic low data in response to the pull-down control signal.

11 Claims, 5 Drawing Sheets

| Description | Measured | | Defined by |
|---|---|---|---|
| | from | to | |
| Single-ended output slew rate for rising edge | $V_{OL(AC)}$ | $V_{OH(AC)}$ | $\dfrac{V_{OH(AC)} - V_{OL(AC)}}{\text{DeltaTRse}}$ |
| Single-ended output slew rate for falling edge | $V_{OH(AC)}$ | $V_{OL(AC)}$ | $\dfrac{V_{OH(AC)} - V_{OL(AC)}}{\text{DeltaTFse}}$ |
| Note: Output slew rate is verified by design and characterization, and may not be subject to production test. | | | |

OUTPUT DRIVER CIRCUIT, SEMICONDUCTOR MEMORY DEVICE INCLUDING THE OUTPUT DRIVER CIRCUIT, AND METHOD FOR OPERATING THE SEMICONDUCTOR MEMORY DEVICE

CROSS-REFERENCE TO RELATED APPLICATION

The present invention claims priority of Korean patent application number 10-2008-0040370, filed on Apr. 30, 2008, which is incorporated by reference in its entirety.

BACKGROUND OF THE INVENTION

The present invention relates to an output driver circuit which is used to output data in all sorts of semiconductor memory devices, and more particularly, to a semiconductor memory device and a method for operating the same, which can improve system integrity (SI) by adjusting the slew rate of the output driver circuit appropriately according to system conditions.

The slew rate acts as a barometer indicating the change of output voltage per unit time.

FIG. 1 illustrates the definition of slew rate in the Joint Electron Device Engineering Council (JEDEC) specification.

$V_{OH(AC)}$ represents a high level alternating current (AC) output, and $V_{OL(AC)}$ represents a low level AC output.

The transition time of a rising edge is defined by a time DeltaTRse from $V_{OL(AC)}$ to $V_{OH(AC)}$, and the transition time of a falling edge is defined by a time DeltaTFse from $V_{OH(AC)}$ to $V_{OL(AC)}$.

The slew rate of the rising edge is defined by "$(V_{OH(AC)}-V_{OL(AC)})$/DeltaTRse", and the slew rate of the falling edge is defined by "$(V_{OH(AC)}-V_{OL(AC)})$/DeltaTFse".

FIG. 2 is a structure diagram illustrating connection configuration between a memory controller and a dual in-line memory module (DIMM).

Referring to FIG. 2, input/output (I/O) data and address (ADD)/command (CMD) between the DIMMs $200_0 \ldots 200_n$ and the memory controller 210 are shared between the DIMMs in a serial stub scheme. The output CLK of clock driver 220 is supplied to the DIMMs $200_0 \ldots 200_n$ and the memory controller 210. Each DIMM $200_0 \ldots 200_n$ has multiple DRAMS, e.g. DRAM0 . . . DRAMn can be seen on DIMM $200_n$.

FIG. 3 illustrates setting the mode register set (MRS) of the termination resistance (RTT) of a double data rate 3 (DDR3) memory device designated in the JEDEC specification.

RTT is the termination resistance of an output driver circuit.

As is well known, the output driver circuit terminates an output node (i.e., data pin) to a pull-up level and outputs logic high data. Furthermore, the output driver circuit terminates the output node to a pull-down level and outputs logic low data. The termination resistance denotes a resistance when the output driver circuit terminates the output node for outputting data.

The setting of RTT is adjusted using addresses A9, A6 and A2, and thus RTT may be adjusted to RZQ/4, RZQ/2, RZQ/6, RZQ/12, RZQ/8, etc. Herein, RZQ denotes a resistance of an external resistor connected to the ZQ node of a memory device, and RZQ becomes generally 240Ω. Accordingly, according to the present regulations of the DDR3, RTT may be set to 60Ω, 120Ω, 40Ω, 20Ω, 30Ω, etc.

The reason why RTT is variously adjustable is that configurations of single loading/double loading are possible according to configuration such as how many DIMMs are inserted in a memory slot and a suitable RTT is selected according to system conditions.

FIG. 4 is a circuit diagram of an output driver circuit of the conventional semiconductor memory device.

Referring to FIG. 4, the conventional output driver circuit includes a pre-driver 410, a pull-up driver 420, and a pull-down driver 430.

The pre-driver 410 generates a pull-up control signal UP_PRE and a pull-down control signal DN_PRE according to a logical value of data to be output.

In operation, an enable signal EN is used to determine a state of an output node DQ. When the enable signal EN is deactivated to 'LOW', the pull-up control signal UP-PRE is deactivated to 'HIGH' and the pull-down control signal DN_PRE is also deactivated to 'LOW'. Thus, the output node DQ maintains a high impedance (Hi-Z) state (no output data).

When the enable signal EN is activated to 'HIGH', data may be output. When data to be output is logic high data, a DATAR signal becomes 'HIGH'. Accordingly, the pull-up control signal UP-PRE is activated to 'LOW' so that the pull-up driver 420 is turned on. Therefore, logic high data are output through the output node DQ. On the other hand, when data to output is logic low data, a DATAF signal becomes 'HIGH'. Thus, the pull-down control signal DN_PRE is activated to 'HIGH' so that the pull-down driver 430 is turned on. Consequently, logic low data are output through the output node DQ.

A plurality of inverters 411 and 412, which are connected in parallel and disposed in respective output terminals outputting the pull-up control signal UP-PRE and the pull-down control signal DN_PRE, are included for adjusting the slew rate. As the number of signals activated to 'HIGH' among signals T<#> increases, the number of inverters enabled among the parallel inverters 411 and 412 increases so that the slew rate increases.

Controller 413 of FIG. 4 adjusts the number of signals activated to 'HIGH' among the signals T<#> (inverted as TB<#>) according to a test mode signal TEST_MODE, and thus adjusts the slew rate in accordance with a test mode.

The pull-up driver 420 is turned on to terminate the output node DQ to a pull-up level when the pull-up control signal UP-PRE is activated to 'LOW'. Accordingly, the output node DQ is changed to 'HIGH' so that logic high data are output. The pull-up driver 420 includes a single PMOS transistor in FIG. 4, but the pull-up driver 420 may include a plurality of PMOS transistors connected in parallel. How much resistance the pull-up driver 420 has, that is, how many transistors are used among parallel-connected transistors, is determined by the setting of RTT of FIG. 3. In more detail, a target resistance of the pull-up driver 420 is determined by the setting of RTT of the FIG. 3, which experiences a fine calibration process for maintaining a constant resistance in spite of changes of a process, a voltage and a temperature (PVT). These contents are well known to those skilled in the art, and thus further detailed description will be omitted.

The pull-down driver 430 is turned on to terminate the output node DQ to a pull-down when the pull-down control signal DN_PRE is activated to 'HIGH'. Accordingly, the output node DQ is changed to the 'LOW' state so that logic low data are output. The pull-down driver 430 also includes a single NMOS transistor in FIG. 4, but the pull-down driver 430 may include a plurality of NMOS transistors connected in parallel. In more detail, a target resistance of the pull-down driver 430 is determined by the setting of RTT of the FIG. 3, which experiences a fine calibration process for maintaining a constant resistance in spite of the changes of PVT.

That is, the conventional output driver circuit includes a configuration for changing the slew rate, but such a slew rate is changed for the purpose of a test in testing.

As described above, the JEDEC specification defines regulations for adjusting RTT appropriately according to system conditions.

When the RTT of the conventional output driver circuit is changed, it is apparent that the signal integrity (SI) is also changed by the change of loading in the output node DQ. However, since the conventional output driver circuit does not at all take into consideration of the change of the slew rate according to the change of RTT in spite of the change of RTT, an error may occur in the signal integrity (SI).

SUMMARY OF THE INVENTION

Embodiments of the present invention are directed to providing a semiconductor memory device and a method for operating the same, which can improve system integrity (SI) of an output driver circuit by adjusting a slew rate according to the change of the termination resistance.

An output driver circuit in accordance with on embodiment of the present invention terminates an output node to a pull-up or pull-down level according to resistance determined by termination resistance setting information to thereby output data, and adjusts the slew rate of the data according to the termination resistance setting information. In accordance with an aspect of the present invention, there is provided an output driver circuit, comprising, a pre-driver configured to generate a pull-up control signal and a pull-down control signal according to a logic value of data to output, and adjust and output a slew rate of the pull-up control signal and a slew rate of the pull-down control signal according to a termination resistance setting information, a pull-up driver configured to output logic high data in response to the pull-up control signal and a pull-down driver configured to output logic low data in response to the pull-down control signal.

DESCRIPTION OF SPECIFIC EMBODIMENTS

Hereinafter, an output driver circuit, a semiconductor memory device including the output driver circuit and a method for operating the semiconductor memory device in accordance with the present invention will be described in detail with reference to the accompanying drawings.

Figure 5:
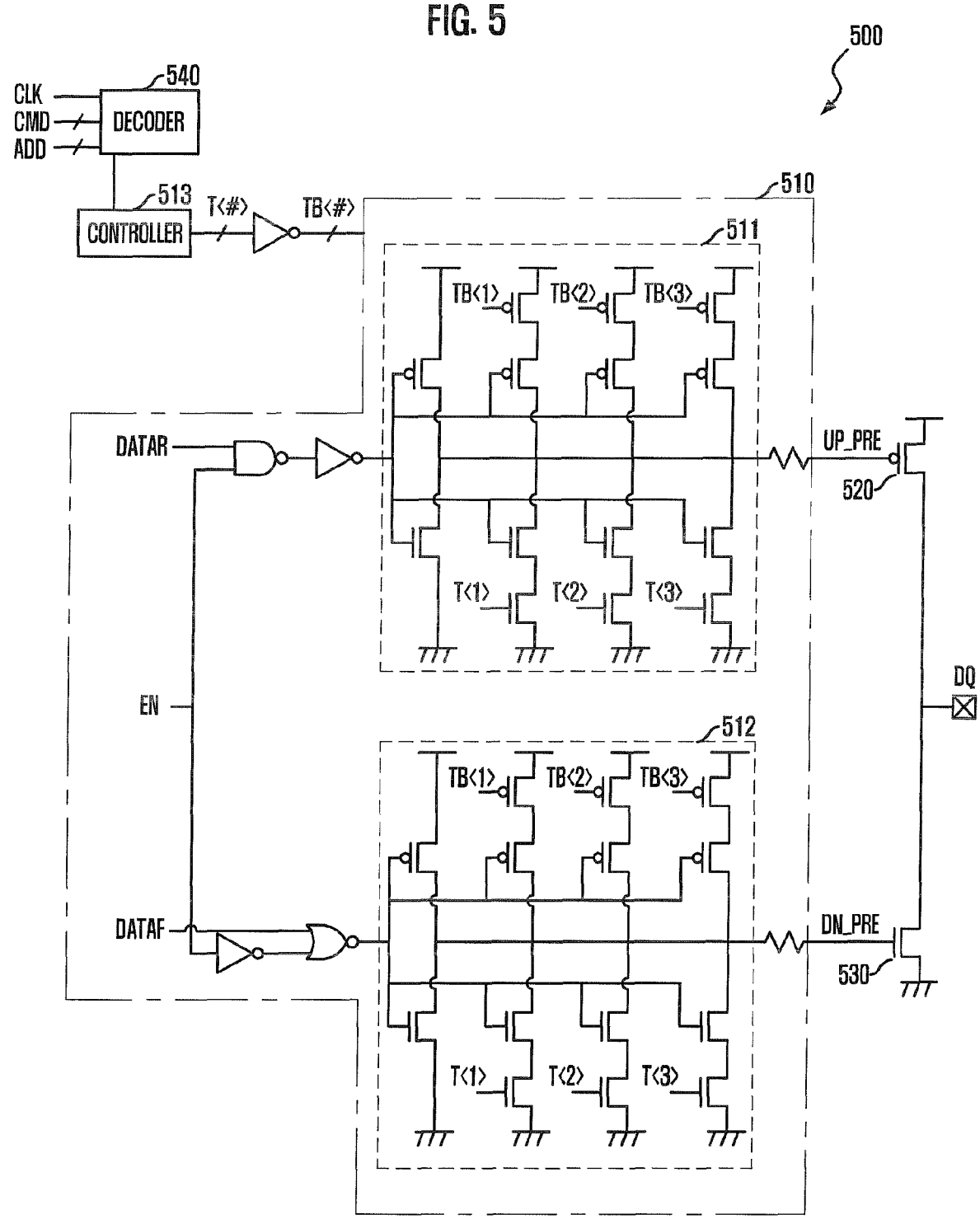
FIG. 5 is a circuit diagram of an output driver circuit of a semiconductor memory device in accordance with one embodiment of the present invention.

FIG. 5 is a circuit diagram of an output driver circuit of a semiconductor memory device in accordance with one embodiment of the present invention.

Figure 1:
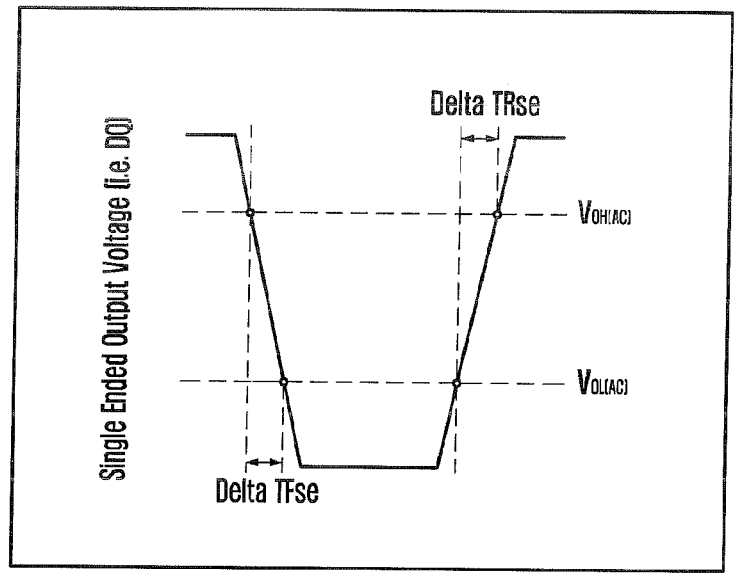
FIG. 1 illustrates the definition of slew rate in the JEDEC specification.
Figure 2:
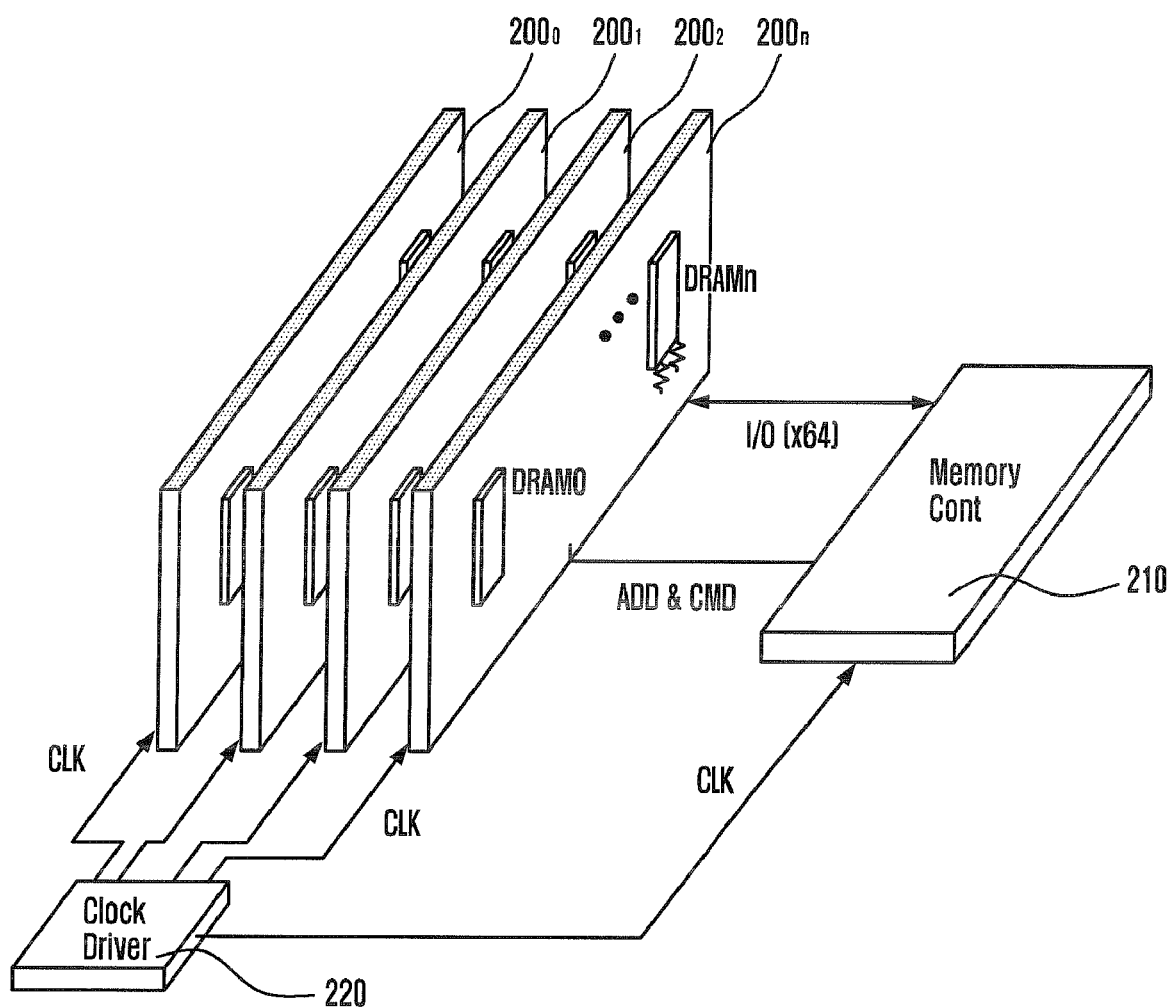
FIG. 2 is a structural diagram illustrating a connection configuration between a memory controller and a DIMM.
Figure 3:
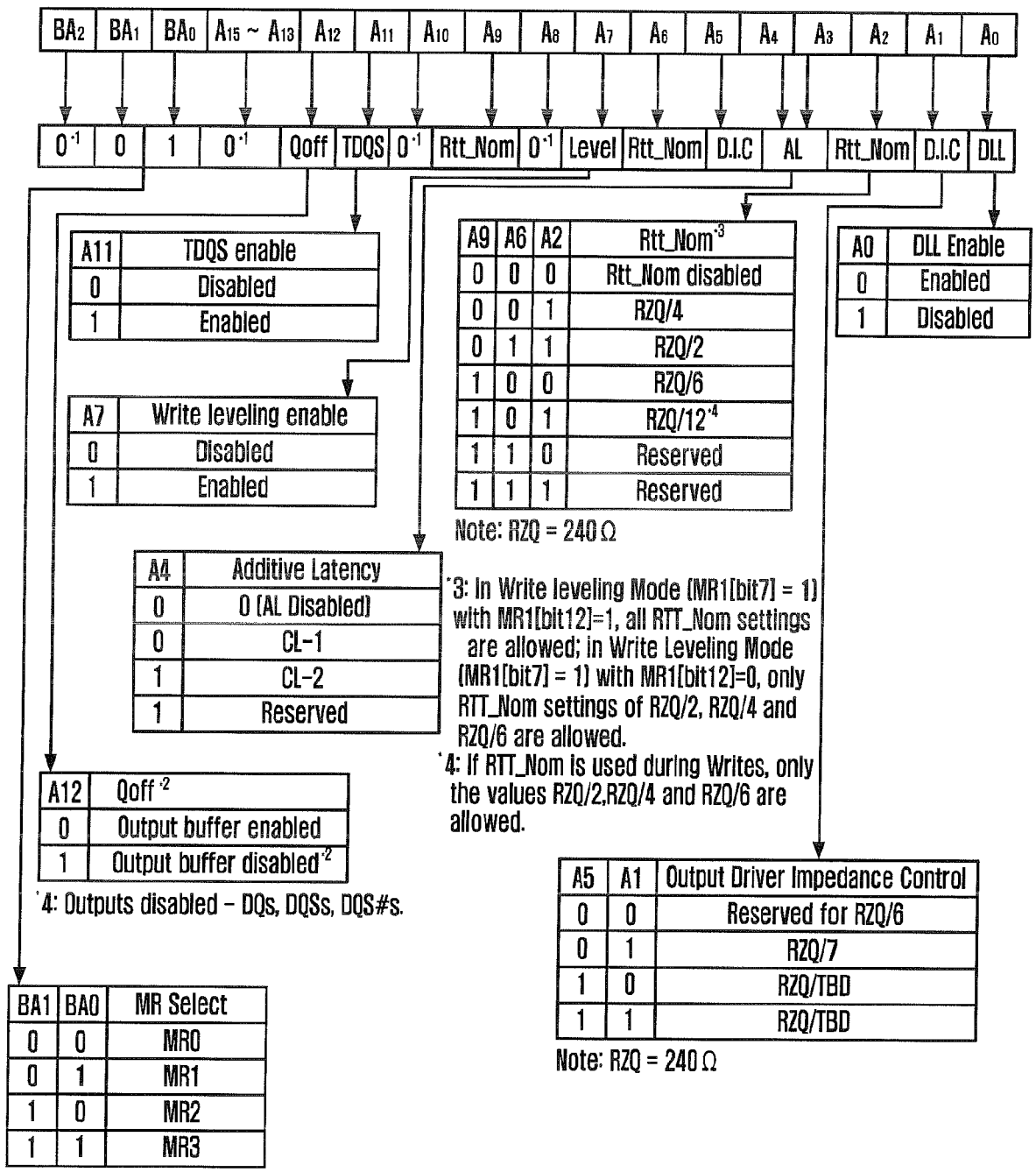
FIG. 3 illustrates the setting of a mode register set (MRS) of a termination resistance (RTT) of a DDR3 memory device in the JEDEC specification.
Figure 4:
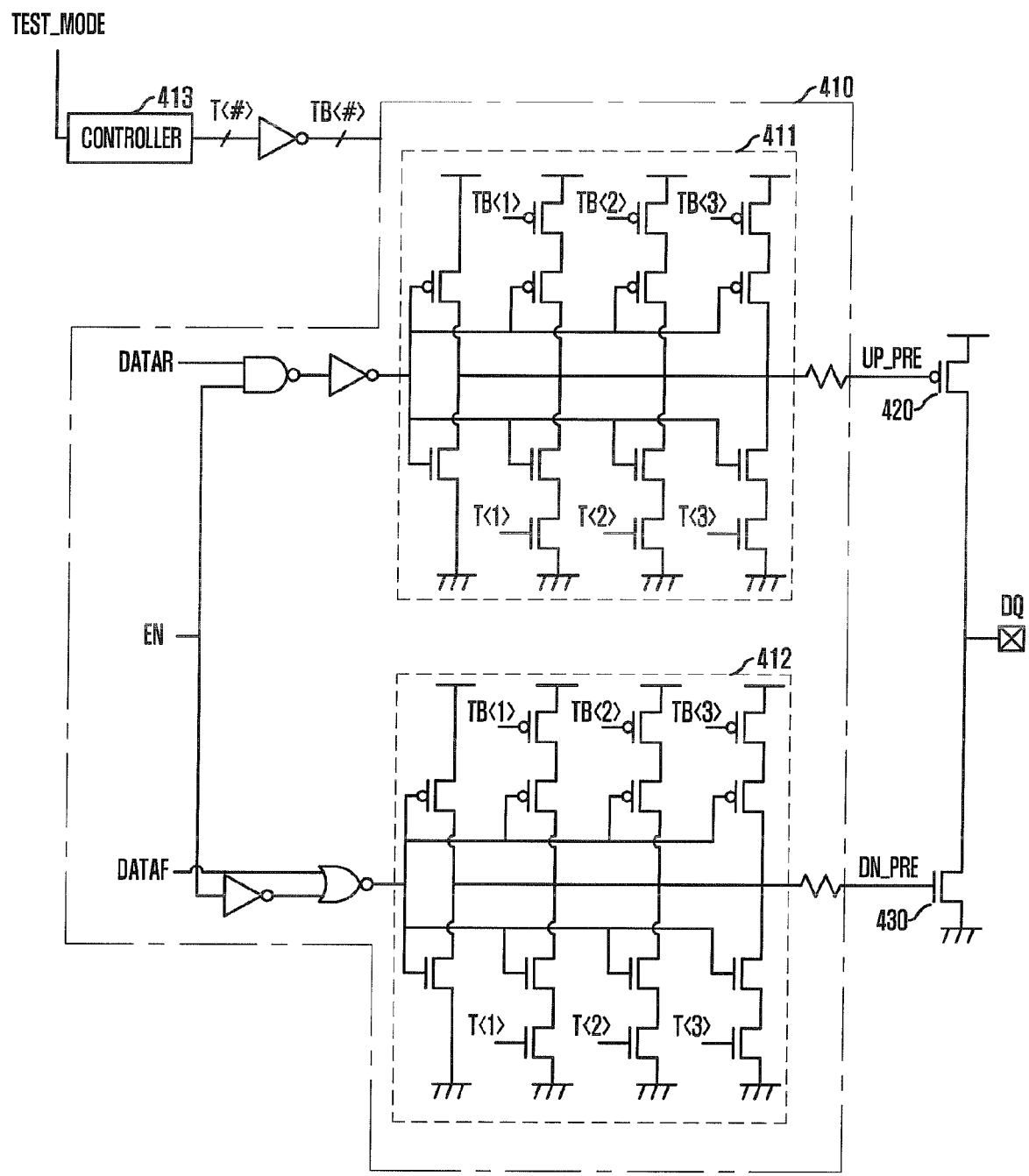
FIG. 4 is a circuit diagram of an output driver circuit of a conventional semiconductor memory device.

Referring to FIG. 5, a decoder 540 generates termination resistance setting information RTT_NOM determined by the combination of an input command CMD and an input address ADD. The termination resistance setting information RTT_NOM has information concerning a termination resistance RTT, which may be set to 60Ω, 120Ω, etc. FIG. 3 illustrates how to set RTT via the combination of the command CMD and the address ADD. The termination resistance setting information RTT_NOM may be configured by various types of signals, such as a binary code or a plurality of signals. Although the termination resistance setting information RTT_NOM is configured by any types of signal, a one-to-one relationship between the combination of the set RTT and signal must be maintained. That is, when RTT is set to 60Ω, 120Ω, 40Ω, 20Ω, 30Ω, etc, each resistance must have a distinguishable signal type.

An output driver circuit 500 in accordance with the embodiment of the present invention terminates an output node DQ to a pull-up or pull-down level according to resistance determined by the termination resistance setting information RTT_NOM to thereby output data, and adjusts the slew rate of the data according to the termination resistance setting information RTT_NOM.

The output driver circuit 500 includes a pre-driver 510, a pull-up driver 520, and a pull-down driver 530. Herein, the pre-driver 510 generates a pull-up control signal UP_PRE and a pull-down control signal DN_PRE according to a logical value of data to output, and adjusts and outputs the slew rate of the pull-up control signal UP_PRE and the slew rate of the pull-down control signal DN_PRE according to the termination resistance setting information RTT_NOM. The pull-up driver 520 outputs logic high data in response to the pull-up control signal UP_PRE. The pull-down driver 530 outputs logic low data in response to the pull-down control signal DN_PRE.

The output driver circuit 500 may further include a controller 513 configured to change the number of signals T<1>, T<2> and T<3> activated according to the termination resistance setting information RTT_NOM. The control signal 513 increases or decreases the number of activated signals as RTT is greatly set, and thus slew rate may be adjusted in proportion to or in inverse proportion to RTT. If the termination resistance setting information RTT_NOM is configured in the same type as types of the signals T<1>, T<2> and T<3>, the controller 513 may be unnecessary.

Moreover, although not shown in FIG. 5, it is apparent that the controller 513 may be designed to change the number of the signals T<1>, T<2> and T<3> activated according to the test mode signal TEST_MODE as well as the termination resistance setting information RTT_NOM.

The pre-driver 510 includes a plurality of first inverters 511 connected in parallel to output the pull-up control signal UP_PRE, and a plurality of second inverters 512 connected in parallel to output the pull-down control signal DN_PRE, wherein the number of the first and second inverters are determined by the signals T<1>, T<2> and T<3>. Since the number of the signals T<1>, T<2> and T<3> to be activated is determined by the termination resistance setting information RTT_NOM, the number of the first inverters 511 necessary for outputting the pull-up control signal UP_PRE and the number of the second inverters 512 necessary for outputting the pull-down control signal DN_PRE are basically determined by the termination resistance setting information RTT_NOM.

That is, the pre-driver 510 adjusts the slew rate of the pull-up control signal UP_PRE and the slew rate of the pull-down control signal DN_PRE according to the termination resistance setting information RTT_NOM. The pull-up driver 520 operates in response to the pull-up control signal UP_PRE, and the pull-down driver 530 operates in response to the pull-down control signal DN_PRE. Accordingly, the slew rate of data output from the output driver circuit 500 is adjusted according to the termination resistance setting information RTT_NOM.

Basic operations related to conditions in which the pre-driver 510 activates the pull-up control signal UP_PRE and the pull-down control signal DN_PRE have been described in detail in the background art, and thus further detailed description will be omitted.

The pull-up driver 520 terminates the output node DQ to a pull-up level when the pull-up control signal UP_PRE is activated to thereby output logic high data. The pull-down driver 530 terminates the output node DQ to a pull-down level when the pull-down control signal DN_PRE is activated to thereby output logic low data. At this point, the RTT of the pull-up driver 520 and the RTT of the pull-down driver 530 are determined by the termination resistance setting information RTT_NOM. The pull-up driver 520 and the pull-down driver 530 have been described in detail in the background art, and thus further detail description will be omitted.

A method for operating the semiconductor memory device in accordance with the embodiment of the present invention will be described with reference to FIG. 5.

The method for operating the semiconductor memory device in accordance with the embodiment of the present invention includes receiving the command CMD and the address ADD for setting RTT, decoding the command CMD and the address ADD to generate the termination resistance setting information RTT_NOM, adjusting a slew rate according to the termination resistance setting information RTT_NOM, and outputting data with the adjusted slew rate.

Referring to FIG. 5, the command CMD and the address ADD are first input to the decoder 540. The decoder 540 decodes the command CMD and the address ADD to generate the termination resistance setting information RTT_NOM. The pre-driver 510 adjusts the slew rate of the pull-up control signal UP_PRE and the slew rate of the pull-down control signal DN_PRE according to the termination resistance setting information RTT_NOM, i.e., the determined RTT. The pull-up driver 520 and the pull-down driver 530 output data with the adjusted slew rate according to the pull-up control signal UP_PRE and the pull-down control signal DN_PRE.

In this way, since the present invention adjusts the slew rate of data output according to the change of RTT, it can improve the signal integrity (SI).

The present invention adjusts and changes the slew rate of the output driver circuit according to the change of the termination resistance. Accordingly, the present invention can improve the signal integrity (SI) by suitably adjusting slew rate according to the change of the termination resistance.

While the present invention has been described with respect to the specific embodiments, it will be apparent to those skilled in the art that various changes and modifications may be made without departing from the spirit and scope of the invention as defined in the following claims.

In particularly, the above-described embodiments have applied the output driver circuit of the present invention to the memory device of the present invention. However, although the output driver circuit of the present invention is applied to semiconductor devices other than the memory device of the present invention, it is apparent that the signal integrity (SI) can be improved by changing slew rate according to RTT.

What is claimed is:

1. An output driver circuit, comprising:
   a pre-driver configured to generate a pull-up control signal and a pull-down control signal according to a logic value of data to be outputted, and configured to adjust a slew rate of the pull-up control signal and a slew rate of the pull-down control signal according to a termination resistance setting information, wherein the termination resistance setting information is determined by a combination of an input command and an input address;
   a pull-up driver configured to output logic high data in response to the pull-up control signal; and
   a pull-down driver configured to output logic low data in response to the pull-down control signal.

2. The output driver circuit as recited in claim 1, wherein the pull-up driver and the pull-down driver are configured to terminate an output node and output the data, and a termination resistance is determined according to the termination resistance setting information.

3. The output driver circuit as recited in claim 1, wherein the pre-driver comprises:
   a plurality of first inverters connected in parallel to output the pull-up control signal; and
   a plurality of second inverters connected in parallel to output the pull-down control signal, a number of the first and second inverters being determined by the termination resistance setting information.

4. The output driver circuit as recited in claim 1, wherein the termination resistance setting information is determined by a mode register set.

5. A semiconductor memory device, comprising:
   a decoder configured to generate a termination resistance setting information determined by a combination of an input command and an input address; and
   an output driver circuit configured to output data by adjusting at least one slew rate according to the termination resistance setting information.

6. The semiconductor memory device as recited in claim 5, wherein the decoder generates the termination resistance setting information according to regulations of a mode register set defined in accordance with a JEDEC specification.

7. The semiconductor memory device as recited in claim 5, wherein the output driver circuit terminates an output node to a pull-up or pull-down level according to a resistance determined by the termination resistance setting information and outputs the data.

8. The semiconductor memory device as recited in claim 5, wherein the output driver circuit comprises:
   a pre-driver configured to generate a pull-up control signal and a pull-down control signal according to a logic value of data to be outputted, and configured to adjust a slew rate of the pull-up control signal and a slew rate of the pull-down control signal according to the termination resistance setting information;
   a pull-up driver configured to output logic high data in response to the pull-up control signal; and
   a pull-down driver configured to output logic low data in response to the pull-down control signal.

9. The semiconductor memory device as recited in claim 8, wherein the pre-driver comprises:
   a plurality of first inverters connected in parallel to output the pull-up control signal; and a plurality of second inverters connected in parallel to output the pull-down control signal, a number of the first and second inverters being determined by the termination resistance setting information.

10. A method for operating a semiconductor memory device, the method comprising:
- receiving a command and an address for setting a termination resistance;
- decoding the command and the address to generate a termination resistance setting information;
- adjusting a slew rate according to the termination resistance setting information; and
- outputting data at the adjusted slew rate.

11. The method as recited in claim 10, wherein the termination resistance setting information is determined by a mode register set.

* * * * *